(12) United States Patent
Otsuka

(10) Patent No.: US 11,901,337 B2
(45) Date of Patent: Feb. 13, 2024

(54) SEMICONDUCTOR DEVICE AND METHOD OF MANUFACTURING THE SAME

(71) Applicant: Kioxia Corporation, Tokyo (JP)

(72) Inventor: Yasuo Otsuka, Kawasaki Kanagawa (JP)

(73) Assignee: KIOXIA CORPORATION, Tokyo (JP)

(*) Notice: Subject to any disclaimer, the term of this patent is extended or adjusted under 35 U.S.C. 154(b) by 119 days.

(21) Appl. No.: 17/465,511

(22) Filed: Sep. 2, 2021

(65) Prior Publication Data
US 2022/0238490 A1 Jul. 28, 2022

(30) Foreign Application Priority Data

Jan. 22, 2021 (JP) ................... 2021-008958

(51) Int. Cl.
*H01L 25/065* (2023.01)
*H01L 25/00* (2006.01)
(Continued)

(52) U.S. Cl.
CPC ...... *H01L 25/0657* (2013.01); *H01L 21/4853* (2013.01); *H01L 21/56* (2013.01); *H01L 23/49811* (2013.01); *H01L 23/49838* (2013.01); *H01L 24/43* (2013.01); *H01L 25/105* (2013.01); *H01L 25/50* (2013.01); *H01L 24/45* (2013.01); *H01L 2224/4321* (2013.01); *H01L 2224/43847* (2013.01); *H01L 2224/45144* (2013.01); *H01L 2225/0651* (2013.01); *H01L 2225/06548* (2013.01); *H01L 2225/06562* (2013.01); *H01L 2225/06586* (2013.01); *H01L 2225/1023* (2013.01); *H01L 2225/1041* (2013.01); *H01L 2225/1058* (2013.01); *H01L 2924/14511* (2013.01)

(58) Field of Classification Search
CPC .................. H01L 25/0657; H01L 23/49811
See application file for complete search history.

(56) References Cited

U.S. PATENT DOCUMENTS 8,158,457 B2  4/2012 Wu
2018/0026007 A1  1/2018 Chau et al.
(Continued)

FOREIGN PATENT DOCUMENTS

JP  2004-172157  6/2004

*Primary Examiner* — Yu-Hsi D Sun
(74) *Attorney, Agent, or Firm* — Foley & Lardner LLP

(57) ABSTRACT

A semiconductor device includes a first wiring substrate having a first surface and a second surface opposite to the first surface, and including a plurality of first electrode pads on the first surface, and a second wiring substrate having a third surface facing the first surface and a fourth surface opposite to the third surface, and including a plurality of second electrode pads on the third surface. A plurality of first semiconductor chips are stacked between the first surface and the third surface. A first columnar electrode extends in an oblique direction with respect to a first direction substantially perpendicular to the first surface and the third surface, and connects between the plurality of first electrode pads and the plurality of second electrode pads. A first resin layer covers the plurality of first semiconductor chips and the first columnar electrode between the first surface and the third surface.

15 Claims, 16 Drawing Sheets

(51) Int. Cl.
    *H01L 23/00*     (2006.01)
    *H01L 21/48*     (2006.01)
    *H01L 21/56*     (2006.01)
    *H01L 23/498*     (2006.01)
    *H01L 25/10*     (2006.01)

(56) References Cited

U.S. PATENT DOCUMENTS

| | | |
|---|---|---|
| 2019/0189585 A1 | 6/2019 | Zhao et al. |
| 2019/0287939 A1 | 9/2019 | Takemoto |
| 2023/0085314 A1* | 3/2023 | Kitamura ................ H01L 23/50 |
| | | 257/668 |

* cited by examiner

SEMICONDUCTOR DEVICE AND METHOD OF MANUFACTURING THE SAME

CROSS-REFERENCE TO RELATED APPLICATION(S)

This application is based upon and claims the benefit of priority from. Japanese Patent Application No. 2021-008958, filed on Jan. 22, 2021, the entire contents of which are incorporated herein by reference.

FIELD

Embodiments described herein relate generally to a semiconductor device and a method of manufacturing the same.

BACKGROUND

A semiconductor package formed by sealing a plurality of semiconductor chips with a resin has been developed. In such a semiconductor package, when multiple semiconductor chips are stacked, a conductor path from the uppermost semiconductor chip to an external connection terminal of the lowermost wiring substrate may be long. If the conductor path is long, delay or attenuation of output signals becomes a problem, which has a risk of deteriorating the reliability of a semiconductor device.

DETAILED DESCRIPTION

Figure 1:
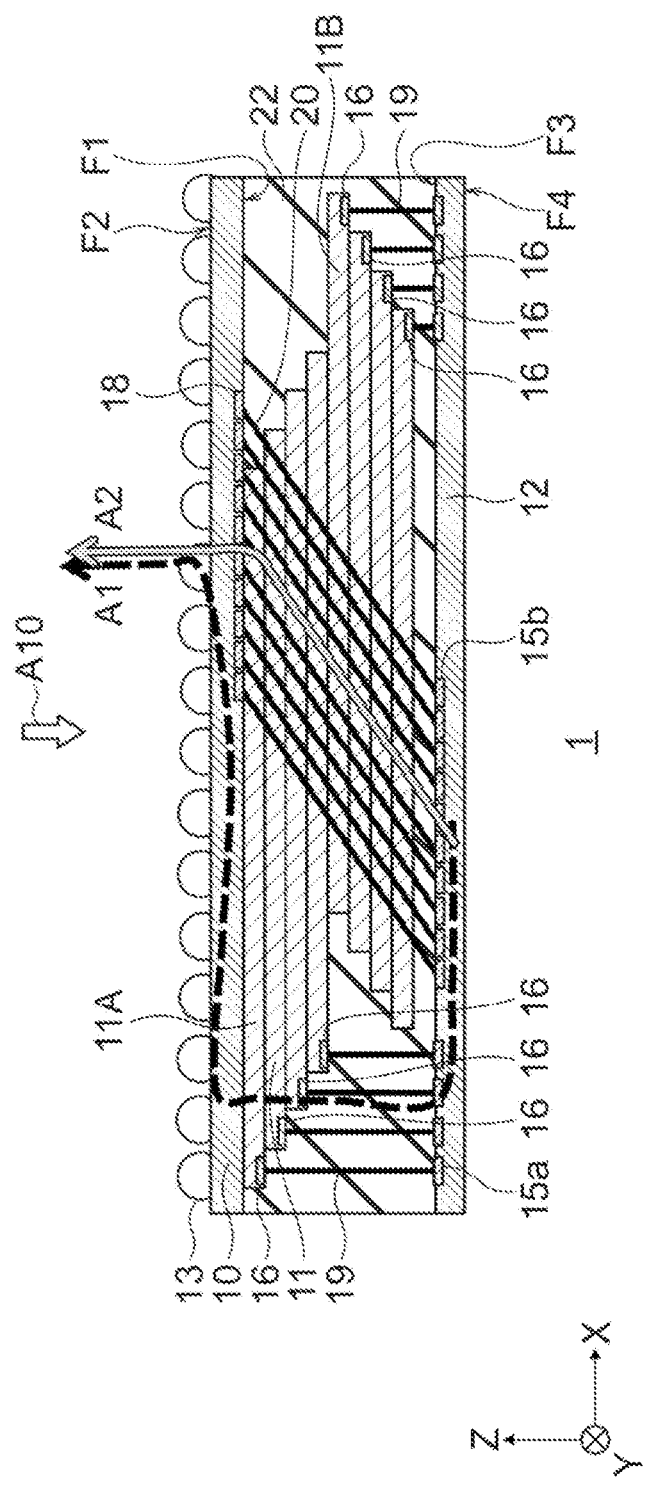
FIG. 1 is a schematic cross-sectional view illustrating a configuration example of a semiconductor device according to a first embodiment.

Embodiments provide a semiconductor device which prevents delay or attenuation of output signals and has high reliability.

In general, according to at least one embodiment, a semiconductor device includes a first wiring substrate having a first surface and a second surface opposite to the first surface, and including a plurality of first electrode pads on the first surface, and a second wiring substrate having a third surface facing the first surface and a fourth surface opposite to the third surface, and including a plurality of second electrode pads on the third surface. A plurality of first semiconductor chips are stacked between the first surface and the third surface. A first columnar electrode extends in an oblique direction with respect to a first direction substantially perpendicular to the first surface and the third surface and connects between the plurality of first electrode pads and the plurality of second electrode pads. A first resin layer covers the plurality of first semiconductor chips and the first columnar electrode between the first surface and the third surface.

Hereinafter, at least one embodiment according to the present disclosure will be described with reference to the drawings. This embodiment does not limit the present disclosure. In the following embodiments, the vertical direction of a semiconductor device indicates the relative direction when the stacking direction of semiconductor chips is upward or downward and may be different from the vertical direction depending on the acceleration of gravity. The drawings are schematic or conceptual, and the scale of each part is not always the same as the actual one. In the specification and the drawings, the same elements as those described above with respect to the existing drawings will be designated by the same reference numerals, and detailed descriptions thereof will be omitted as appropriate.

First Embodiment

FIG. 1 is a schematic cross-sectional view illustrating a configuration example of a semiconductor device 1 according to a first embodiment. The semiconductor device 1 includes a wiring substrate 10, a wiring substrate 12, a semiconductor chip 11, a columnar electrode 19, a columnar electrode 20, a resin layer 22, and a metal bump 13. The semiconductor device 1 may be, for example, a semiconductor package such as a NAND flash memory or a large scale integration (LSI).

The wiring substrate 10 has a first surface F1 and a second surface F2 opposite to the first surface F1. A plurality of electrode pads 18 are provided on the first surface F1. The electrode pads 18 are electrically connected, respectively, to any one of wiring layers of the wiring substrate 10. The wiring substrate 10 has a multilayer wiring structure (not illustrated) in which a plurality of wiring layers and a plurality of insulating layers are stacked. For the electrode pads 18 and the wiring layers, for example, a simple substance such as Al, Cu, Au, Ni, Pd, W, or Ti, a composite film of two or more of them, or a low-resistance metal such as an alloy of two or more of them is used. For the insulating layers, for example, an insulating member such as a glass epoxy resin is used.

The wiring substrate 12 has a third surface F3 facing the first surface F1 and a fourth surface F4 opposite to the third surface F3. A plurality of electrode pads 15a and 15b are provided on the third surface F3. The electrode pads 15a and 15b are electrically connected, respectively, to any one of wiring layers of the wiring substrate 12. The wiring substrate 12 has a multilayer wiring structure (not illustrated) in which a plurality of wiring layers and a plurality of insulating layers are stacked. For the electrode pads 15a and 15b and the wiring layers, for example, a simple substance such as Al, Cu, Au, Ni, Pd, W, or Ti, a composite film of two or more of them, or a low-resistance metal such as an alloy of two or more of them is used. For the insulating layers, for example, an insulating member such as a glass epoxy resin is used. The first surface F1 of the wiring substrate 10 and the third surface F3 of the wiring substrate 12 face each other, and a plurality of stacked semiconductor chips 11 are sandwiched therebetween.

The plurality of semiconductor chips 11 are stacked between the first surface F1 and the third surface F3. In at least one embodiment, the plurality of semiconductor chips 11 are stacked on the first surface F1 of the wiring substrate 10. Semiconductor elements (not illustrated) such as a memory cell array, a transistor, and a capacitor are provided on the surface of each semiconductor chip 11. The semiconductor chips 11 may be, for example, a memory chip of a NAND flash memory in which a plurality of memory cells are three-dimensionally arranged, or a semiconductor chip equipped with any LSI. The semiconductor chips 11 may be semiconductor chips having the same configuration as each other, or may be semiconductor chips having different configurations from each other.

The plurality of semiconductor chips 11 are stacked and are adhered by an adhesive layer (not illustrated). Examples of the adhesive layer include a resin such as a phenol based resin, a polyimide based resin, a polyamide based resin, an acryl based resin, an epoxy based resin, a p-phenylene benzobisoxazole (PBO) based resin, a silicone based resin, and a benzocyclobutene based resin, and an organic insulating material such as a mixed material thereof and composite material.

The plurality of semiconductor chips 11 each have an electrode pad 16 exposed on the surface thereof facing the third surface F3. Any other semiconductor chip 11 stacked on the semiconductor chip 11 is shifted substantially in the vertical direction (X direction) with respect to the side of the underlying semiconductor chip 11 where the electrode pad 16 is provided so as not to overlap the electrode pad 16 of the underlying semiconductor chip 11. In addition, the direction substantially perpendicular to the first surface F1 and the third surface F3 (the stacking direction of the semiconductor chips 11) is the Z direction, one direction in a plane perpendicular to the Z direction is the X direction, and a direction orthogonal to both the Z direction and the X direction is the Y direction.

The electrode pad 16 is electrically connected to any one of semiconductor elements provided in the semiconductor chip 11. For the electrode pad 16, for example, a simple substance such as Al, Cu, Au, Ni, Pd, W, or Ti, a composite film of two or more thereof, or a low-resistance metal such as an alloy of two or more of them is used.

The columnar electrode 19 is connected between the electrode pad 16 of the semiconductor chip 11 and the electrode pad 15a of the wiring substrate 12, and the columnar electrode 20 extends in the Z direction substantially perpendicular to the first surface F1 and the third surface F3. The Z direction may be the stacking direction of the plurality of semiconductor chips 11 or the direction in which the first surface F1 and the third surface F3 face each other. The lower end of the columnar electrode 19 is connected to the electrode pad 15a by a wire bonding method. For the columnar electrode 19, for example, a conductive bonding wire such as a gold wire is used.

One end of the columnar electrode 20 is connected to the electrode pad 18 of the wiring substrate 10, and the other end thereof is connected to the electrode pad 15b of the wiring substrate 12. That is, the columnar electrode 20 connects between the electrode pad 18 and the electrode pad 15b. The electrode pads 18 and 15b which correspond to each other and are connected by one columnar electrode 20 do not overlap completely when viewed from the Z direction as a first direction, but are shifted in the X direction or the Y direction. The electrode pads 18 and 15b may partially overlap when viewed from the Z direction. Thus, the columnar electrode 20 extends in an oblique direction with respect to the Z direction substantially perpendicular to the first surface F1 and the third surface F3. Further, the columnar electrode 20 is also oblique with respect to the X direction. After being connected to the electrode pad 18 by a wire bonding method, the columnar electrode 20 is pulled out in the oblique direction and is cut to a predetermined length. A wire which is to be the columnar electrode 20 stands on its own in a state of extending in the oblique direction after cutting. For the columnar electrode 20, for example, a conductive bonding wire such as a gold wire is used.

The resin layer 22 covers (seals) the plurality of stacked semiconductor chips 11 and the columnar electrodes 19 and 20 between the first surface F1 and the third surface F3. For the resin layer 22, for example, a resin such as a phenol based resin, a polyimide based resin, a polyamide based resin, an acryl based resin, an epoxy based resin, a PBO based resin, a silicone based resin, or a benzocyclobutene based resin, or an organic insulating material such as a mixed material thereof or composite material is used.

The metal bump 13 is provided on the second surface F2 of the wiring substrate 10. The metal bump 13 is electrically connected to the plurality of electrode pads 18 via the wiring substrate 10. The metal bump 13 is used for connection with any other wiring substrate or any other semiconductor package. For the metal bump 13, for example, a conductive material such as a solder is used. In addition, the metal bump 13 may be provided on the fourth surface F4 of the wiring substrate 12, and may be electrically connected to the electrode pads 15a and 15b via the wiring substrate 12.

Figure 2A:
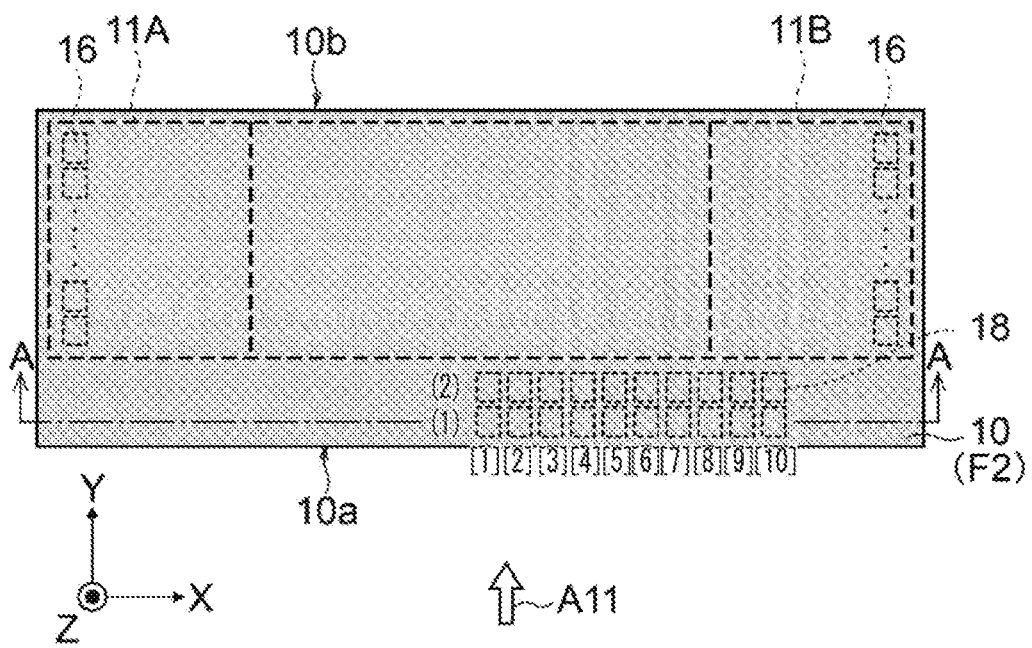
FIG. 2A is a see-through plan view illustrating an arrangement of electrode pads on a wiring substrate.
Figure 2B:
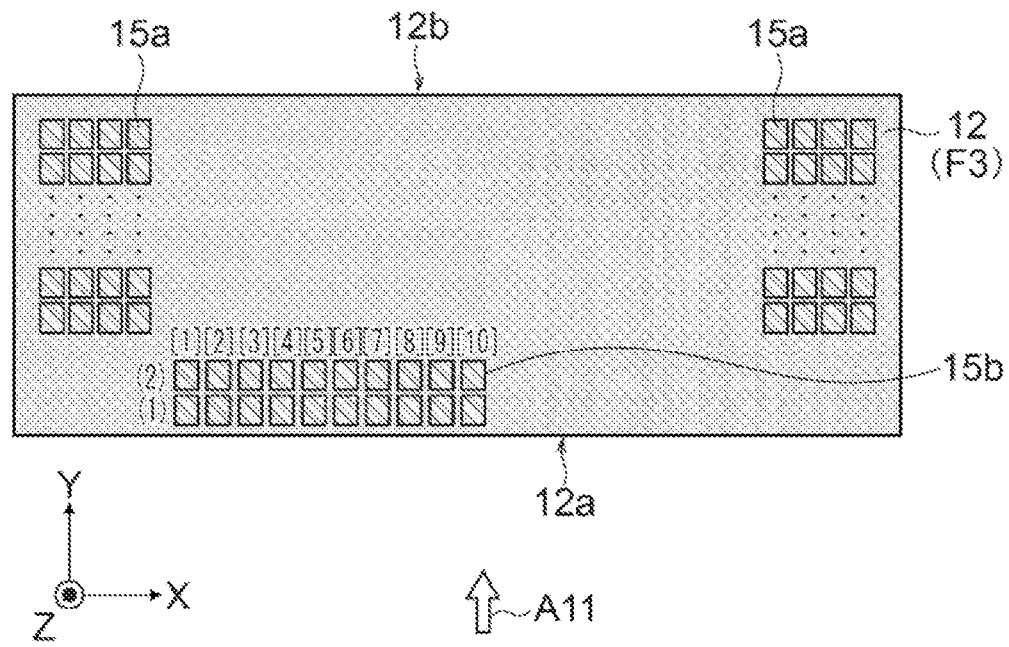
FIG. 2B is a schematic plan view illustrating an arrangement of electrode pads on a wiring substrate.

FIG. 2A is a see-through plan view illustrating an arrangement of the electrode pads 18 on the wiring substrate 10. FIG. 2B is a schematic plan view illustrating an arrangement of the electrode pads 15b on the wiring substrate 12. FIG. 2A illustrates an arrangement of the wiring substrate 10 as seen-through from the second surface F2 side of the wiring substrate 10, and FIG. 2B illustrates the wiring substrate 12 as viewed from the third surface F3 side of the wiring substrate 12. That is, both of FIGS. 2A and 2B are schematic plan views as viewed from above in the Z direction (the direction of arrow A10 in FIG. 1). Further, FIG. 1 illustrates a schematic cross-sectional view as viewed from the direction of arrow A11 of FIGS. 2A and 2B. In addition, in FIGS. 2A and 2B, the positions of the electrode pads 18, 15a and 15b in the wiring substrates 10 and 12 are illustrated, and the illustration of other components such as the metal bump 13 is omitted. Originally, the electrode pads 18 of the wiring substrate 10 and semiconductor chips 11A and 11B are not visible when viewed from the second surface F2 side, but are schematically depicted in a see-through view in FIG. 2A. The semiconductor chip 11A is a semiconductor chip that is closest to the wiring substrate 10 illustrated in FIG. 1, and is biased to the leftmost end. The semiconductor chip 11B is a semiconductor chip that is in the middle of FIG. 1, and is biased to the rightmost end.

When the wiring substrates 10 and 12 are part of the package illustrated in FIG. 1, a side 10a of FIG. 2A and a side 12a of FIG. 2B correspond to each other, and a side 10b of FIG. 2A and a side 12b of FIG. 2B correspond to each other. Thus, an arrangement state illustrated in FIG. 1 is achieved. When viewed in a plan view from the Z direction, the sides 10a and 12a almost overlap, and the sides 10b and 12b also almost overlap. The electrode pads 15b and 18 are unevenly distributed toward the sides 10a and 12a. FIG. 1 corresponds to the cross section taken along line A-A in FIG. 2A. In FIG. 1, the sides 10a and 12a are arranged on the front side in the page. The semiconductor chip 11 is not originally visible in the cross-sectional view of FIG. 1, but is schematically depicted in FIG. 1. When viewed in a plan view from the Z direction, the electrode pad 18 and the electrode pad 15b connected by the columnar electrode 20 are shifted substantially in parallel from each other along the sides 10a and 12a. Thus, as illustrated in FIG. 1, the columnar electrode 20 is wired obliquely in the Z direction.

In the first embodiment, as illustrated in FIG. 2A, assuming that the X direction is the row and the Y direction is the column, the electrode pads 18 are arranged in two rows in the row direction and ten columns in the column direction. As illustrated in FIG. 2B, the electrode pads 15b are also arranged in two rows in the row direction and ten columns in the column direction. Thus, the electrode pads 18 and the electrode pads 15b correspond to each other in a one to one ratio, and the respective corresponding electrode pads 18 and 15b are connected by the columnar electrode 20.

For example, it is assumed that (1) and (2) in FIGS. 2A and 2B represent rows and [1] to [10] represent columns. At this time, the electrode pad 18 of (k) row and [j] column (k=1, 2, j=1~10) is connected to the electrode pad 15b of (k) row and [j] column. The electrode pads 18 and 15b are arranged in the X and Y directions at substantially equal intervals, respectively. Thus, the respective columnar electrodes 20 are oblique at substantially the same angle, and do not come in contact with each other.

According to the first embodiment, an electrical path from the wiring substrate 12 to the metal bump 13 reaches the metal bump 13 through the electrode pad 15b, the columnar electrode 20, the electrode pad 18, and the wiring substrate 10 from the wiring substrate 12.

A case where the columnar electrode 20 is not provided will be described as a comparative example. An electrical path from the wiring substrate 12 to the metal bump 13 reaches the metal bump 13 through the electrode pad 15a, the columnar electrode 19, the electrode pad 16, the semiconductor chip 11, and the wiring substrate 10 (e.g., normal wire bonding being used from the semiconductor chip 11 to the wiring substrate 10) from the wiring substrate 12. In this way, when the electrical path does not pass through the columnar electrode 20 as the comparative example, the semiconductor chip 11 and the columnar electrode 19 extending in the Z direction are interposed in a wiring path from the metal bump 13 to the wiring substrate 12. Therefore, there is a risk of the wiring path becoming long since it is necessary to pass through a wiring in the semiconductor chip 11. For example, when the columnar electrode 20 is not provided, the path from a certain electrode pad 15b to a certain electrode pad 18 is detoured as indicated by the broken line arrow A1 in FIG. 1.

In contrast, in the semiconductor device 1 according to the first embodiment, the semiconductor chip 11 is not interposed in the wiring path from the wiring substrate 12 to the metal bump 13, and the electrode pad 15b of the wiring substrate 12 and the electrode pad 18 of the wiring substrate 10 are directly connected by the columnar electrode 20. The columnar electrode 20 is oblique according to the relative positions of the electrode pads 15b and 18 connected to each other. Thus, the wiring path from the wiring substrate 12 to the metal bump 13 is shortened.

For example, as indicated by the solid line arrow A2 in FIG. 1, the electrode pad 15b is connected to the electrode pad 18 via the oblique columnar electrode 20. Accordingly, the electrode pad 15b may be connected to the electrode pad 18 by a relatively short path as indicated by the solid line arrow A2 without detouring. As a result, delay or attenuation of output signals from the semiconductor chip 11 may be prevented, and the reliability of the semiconductor device 1 may be improved.

Second Embodiment

Figure 3:
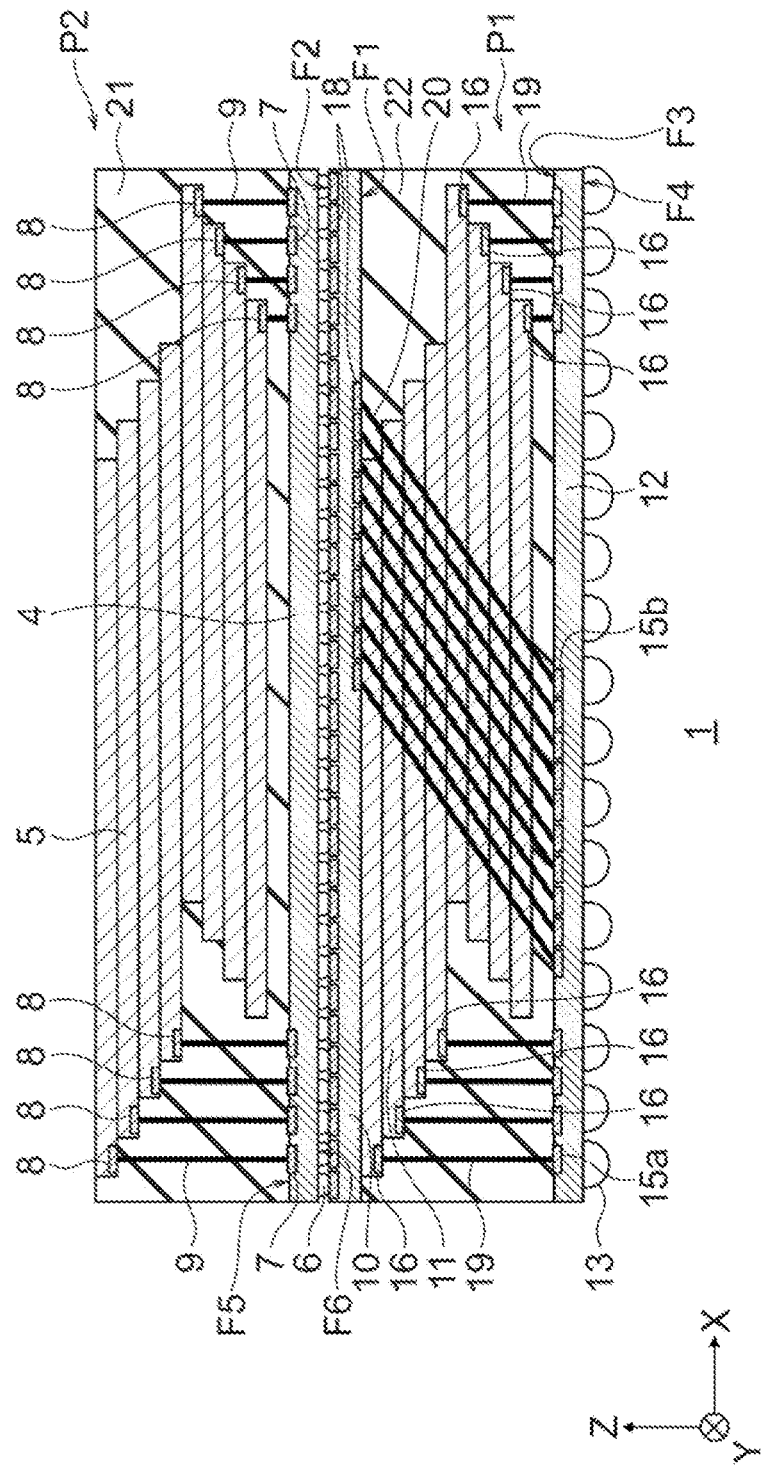
FIG. 3 is a schematic cross-sectional view illustrating a configuration example of a semiconductor device according to a second embodiment.

FIG. 3 is a schematic cross-sectional view illustrating a configuration example of the semiconductor device 1 according to a second embodiment. In the second embodiment, another package P2 is stacked on a package P1.

The package P1 is different from the first embodiment in that the electrode pads 18 are provided on the second surface F2 of the wiring substrate 10. Other configurations of the package P1 may be the same as those of the semiconductor device 1 of the first embodiment.

The package P2 includes a wiring substrate 4, a semiconductor chip 5, a columnar electrode 9, a resin layer 21, and a metal bump 6.

The wiring substrate 4 has a fifth surface F5 and a sixth surface F6 opposite to the fifth surface F5. A plurality of electrode pads 7 are provided on the fifth surface F5. The wiring substrate 4 has a multilayer wiring structure (not illustrated) in which a plurality of wiring layers and a plurality of insulating layers are stacked. The electrode pads 7 and the wiring layers are electrically connected to any one of wiring layers of the wiring substrate 4. For the electrode pads 7, for example, a simple substance such as Al, Cu, Au, Ni, Pd, W, or Ti, a composite film of two or more of them, or a low-resistance metal such as an alloy of two or more of them is used. For the insulating layers, for example, an insulating member such as a glass epoxy resin is used. A plurality of stacked semiconductor chips 5 are provided above the wiring substrate 4.

The plurality of semiconductor chips 5 are stacked above the fifth surface F5. Each semiconductor chip 5 has semiconductor elements (not illustrated) such as a memory cell array, a transistor, and a capacitor, similarly to the semiconductor chip 11. The semiconductor chips 5 may be, for example, a memory chip of a NAND flash memory in which a plurality of memory cells are three-dimensionally arranged, or a semiconductor chip equipped with any LSI. The semiconductor chips 5 may be semiconductor chips having the same configuration as each other, or may be semiconductor chips having different configurations from each other.

The plurality of semiconductor chips 5 are adhered to each other by an adhesive layer (not illustrated). The material of the adhesive layer is as described above.

The plurality of semiconductor chips 5 each have an electrode pad 8 exposed on the surface thereof. Any other semiconductor chip 5 stacked on the semiconductor chip 5 is shifted substantially in the vertical direction (X direction) with respect to the side of the underlying semiconductor chip 5 where the electrode pad 8 is provided so as not to overlap the electrode pad 8 of the underlying semiconductor chip 5.

The electrode pad 8 is electrically connected to any one of semiconductor elements provided in the semiconductor chip 5. For the electrode pad 8, for example, a simple substance such as Al, Cu, Au, Ni, Pd, W, or Ti, a composite film of two or more of them, or a low-resistance metal such as an alloy of two or more of them is used.

The columnar electrode 9 is connected between the electrode pad 8 of the semiconductor chip 5 and the electrode pad 7 of the wiring substrate 4, and extends in the Z direction substantially perpendicular to the fifth surface F5. The lower end of the columnar electrode 9 is connected to the electrode pad 7 by a wire bonding method. For the columnar electrode 9, for example, a conductive bonding wire such as a gold wire is used.

The resin layer 21 covers (seals) the plurality of stacked semiconductor chips 5 and the columnar electrode 9 on the fifth surface F5 side. For the resin layer 21, for example, a resin such as a phenol based resin, a polyimide based resin, a polyamide based resin, an acryl based resin, an epoxy based resin, a PBO based resin, a silicone based resin, or a benzocyclobutene based resin, or an organic insulating material such as a mixed material thereof or composite material is used.

The metal bump 6 is provided on the sixth surface F6 of the wiring substrate 4. The metal bump 6 is electrically connected to the plurality of electrode pads 7 via the wiring substrate 4. The metal bump 6 is used for connection with the electrode pads 18 of the wiring substrate 10 of the package P1. For the metal bump 6, for example, a conductive material such as a solder is used.

In this way, the package P2 is stacked on the second surface F2 of the wiring substrate 10, and is electrically connected to the wiring substrate 10.

As in the second embodiment, a plurality of packages P1 and P2 may be stacked. Even with such a configuration, the same effects as those of the first embodiment may be obtained.

Third Embodiment

Figure 4:
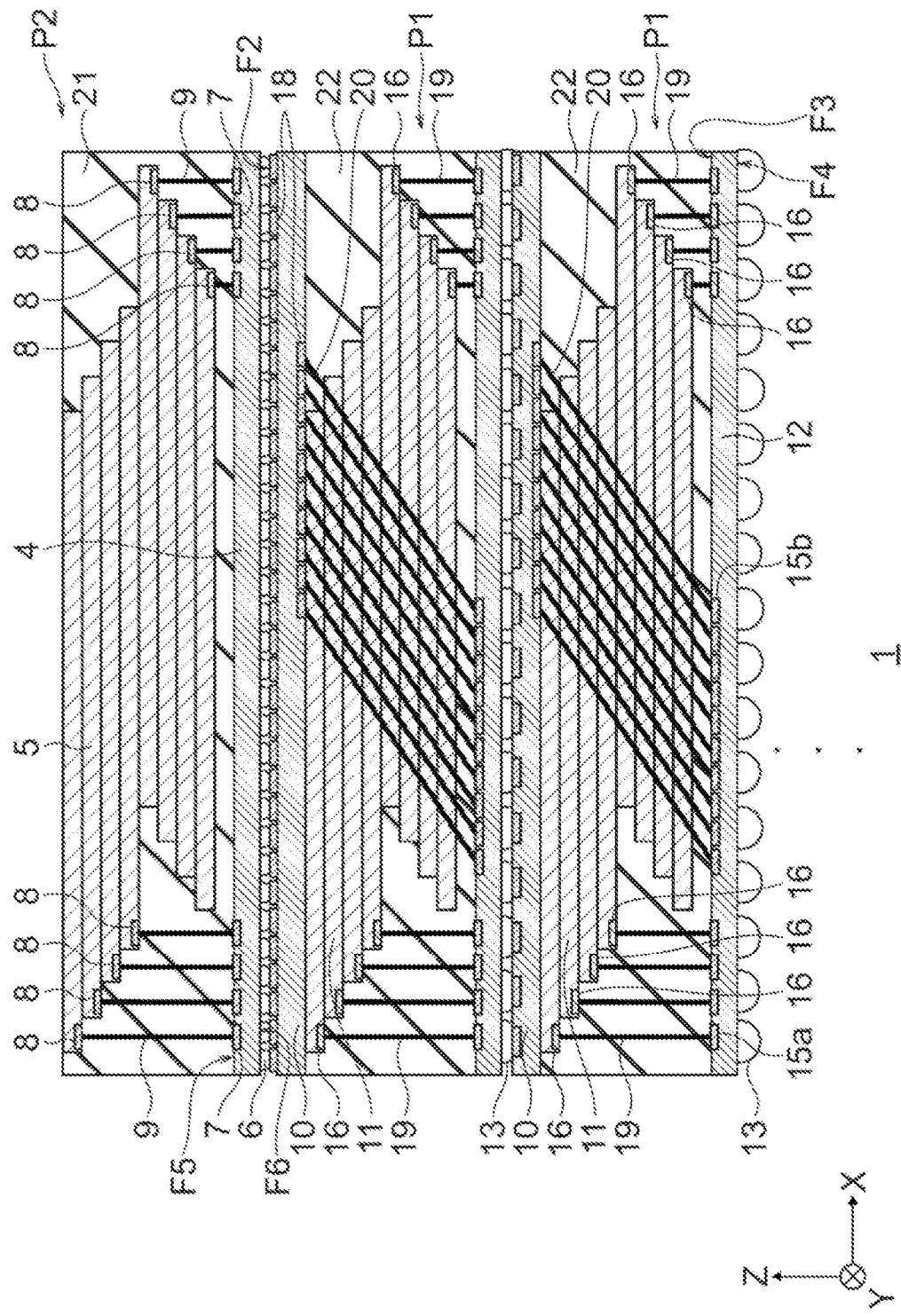
FIG. 4 is a schematic cross-sectional view illustrating a configuration example of a semiconductor device according to a third embodiment.

FIG. 4 is a schematic cross-sectional view illustrating a configuration example of the semiconductor device 1 according to a third embodiment. In the third embodiment, a plurality of packages P1 are stacked, and the package P2 is stacked thereon. The package P2 is stacked on the uppermost package P1 among the plurality of stacked packages P1. The package P2 is stacked on the package P1 and may not require a rewiring layer. In such a case, a wiring substrate may not be provided on the package P2. Other configurations of the third embodiment may be the same as corresponding configurations of the second embodiment. Thus, the third embodiment may obtain the same effects as in the second embodiment.

Fourth Embodiment

Figure 5:
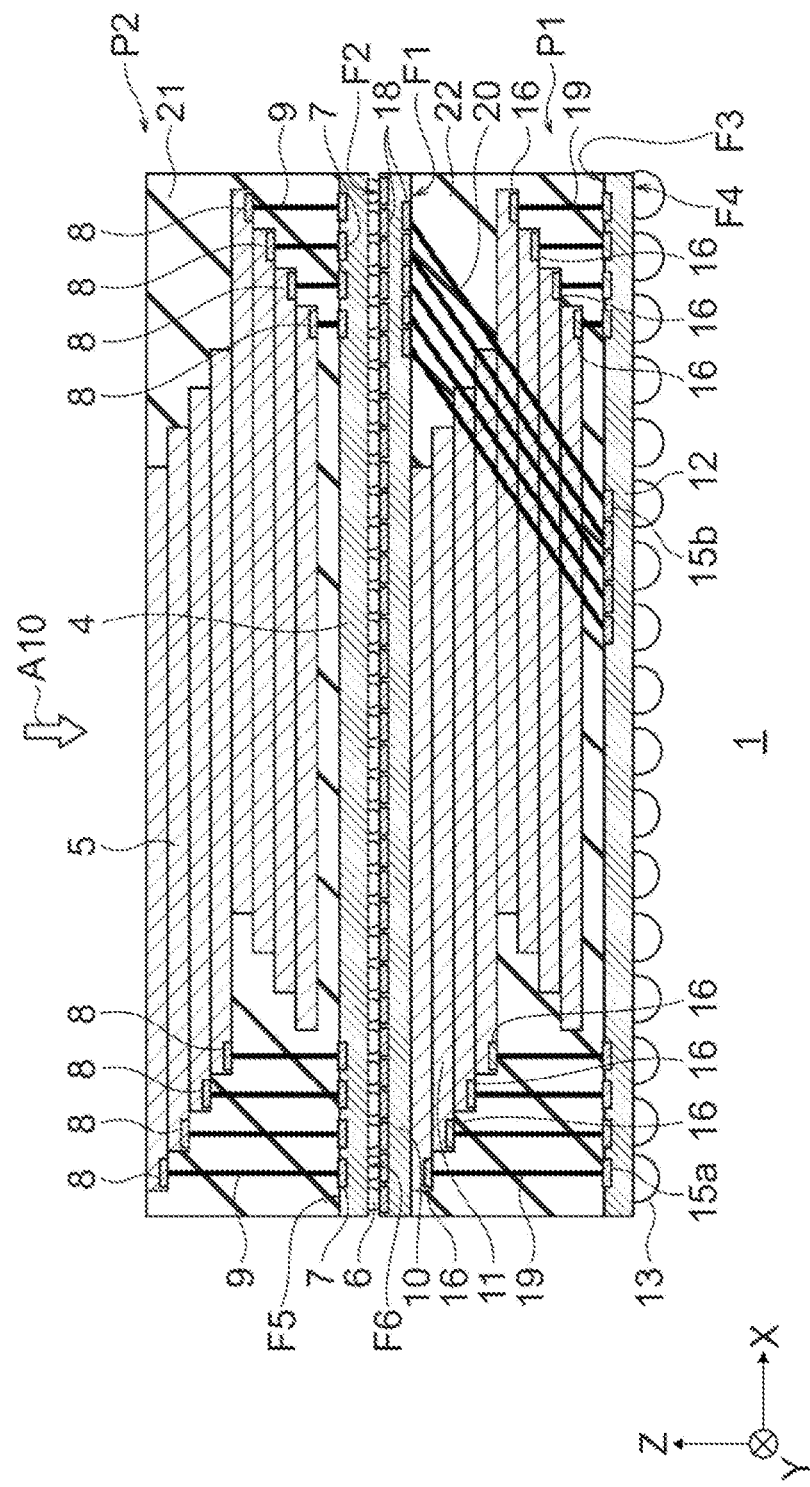
FIG. 5 is a schematic cross-sectional view illustrating a configuration example of a semiconductor device according to a fourth embodiment.

FIG. 5 is a schematic cross-sectional view illustrating a configuration example of the semiconductor device 1 according to a fourth embodiment. In the fourth embodiment, an arrangement of the electrode pads 18 of the wiring substrate 10 and the electrode pads 15b of the wiring substrate 12 is different from that of the second embodiment. In addition to this, a configuration of the columnar electrode 20 of the fourth embodiment is different from that of the second embodiment.

Figure 6A:
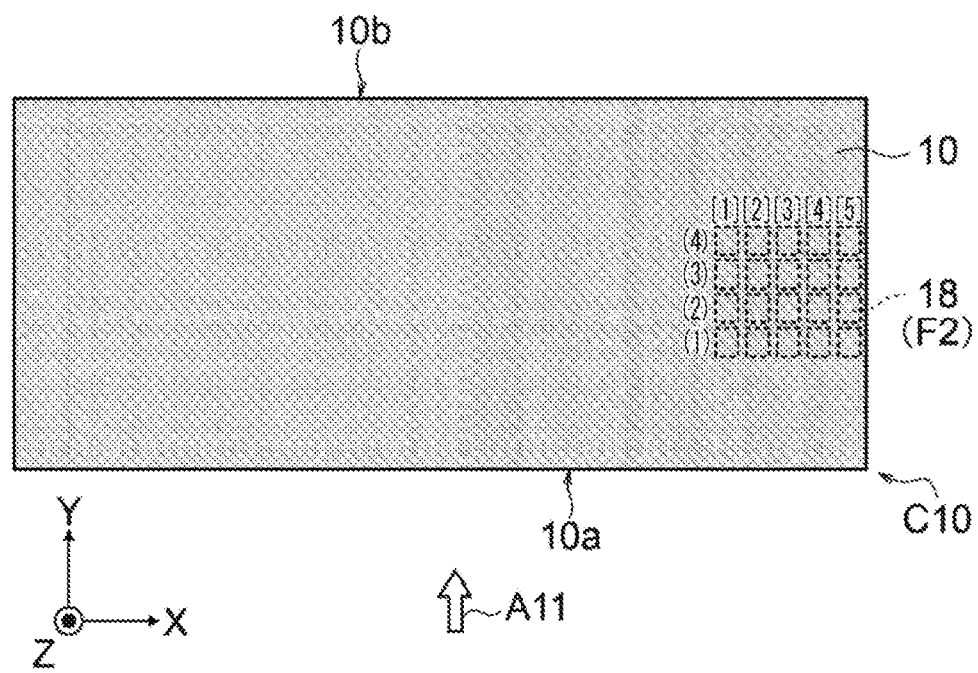
FIG. 6A is a see-through plan view illustrating an arrangement of electrode pads on a wiring substrate.
Figure 6B:
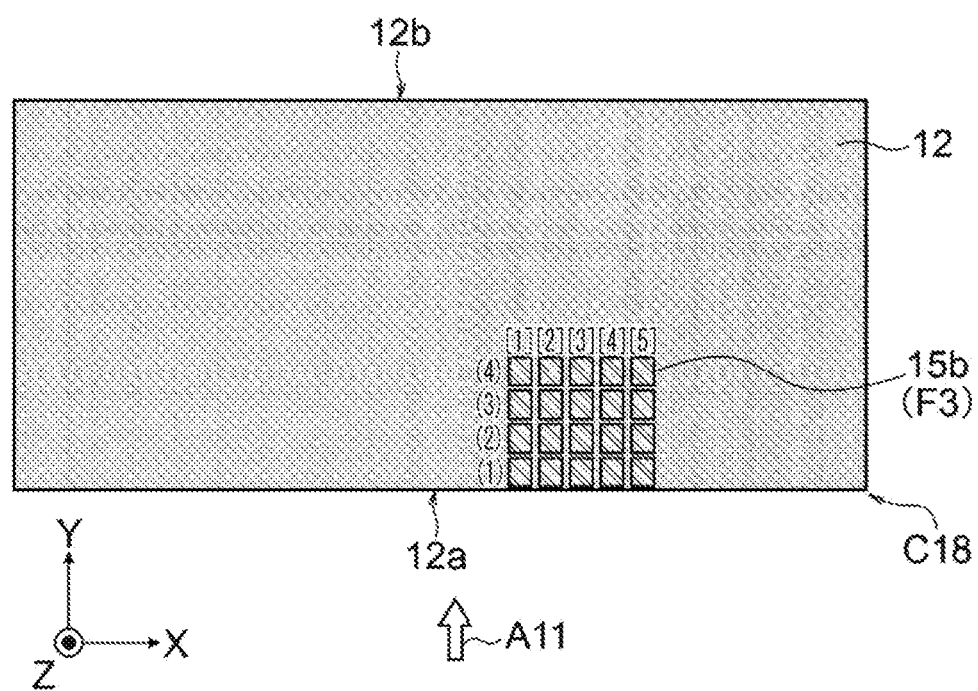
FIG. 6B is a schematic plan view illustrating an arrangement of electrode pads on a wiring substrate.

FIG. 6A is a see-through plan view illustrating an arrangement of the electrode pads 18 on the wiring substrate 10. FIG. 6B is a schematic plan view illustrating an arrangement of the electrode pads 15b on the wiring substrate 12. FIG. 6A illustrates an arrangement of the wiring substrate 10 as seen through the second surface F2 side, and FIG. 6B illustrates the wiring substrate 12 as viewed from the third surface F3 side. That is, both of FIGS. 6A and 6B illustrate schematic plan views as viewed from above in the Z direction (the direction of arrow A10 in FIG. 5). Further, FIG. 5 illustrates a schematic cross-sectional view as viewed from the direction of arrow A11 of FIGS. 6A and 6B. In addition, in FIGS. 6A and 6B, the positions of the electrode pads 18 and 15b in the wiring substrates 10 and 12 are illustrated, and the illustration of other components such as other electrode pads 15a or the metal bump 6 is omitted. Originally, the electrode pads 18 of the wiring substrate 10 are not visible when viewed from the second surface F2 side, but are schematically depicted as a see-through view in FIG. 6A.

When the wiring substrates 10 and 12 constitute the package illustrated in FIG. 5, the side 10a of FIG. 6A and the side 12a of FIG. 6B correspond to each other, and the side 10b of FIG. 6A and the side 12b of FIG. 6B correspond to each other. Thus, an arrangement state illustrated in FIG. 5 is achieved. When viewed in a plan view from the Z direction, the sides 10a and 12a almost overlap, and the sides 10b and 12b also almost overlap.

In addition, the electrode pads 18 are unevenly distributed toward a side 10c. The side 10c is a side that is adjacent to the side 10b of the wiring substrate 10 and extends in the Y direction substantially perpendicular to the side 10b. Further, the electrode pads 15b are unevenly distributed toward the side 12a. When viewed in a plan view from the Z direction, the electrode pad 18 and the electrode pad 15b connected by the columnar electrode 20 are shifted from each other since they are unevenly distributed toward the sides 10c and 12a. Thus, the columnar electrode 20 is wired obliquely from the Z direction to the X direction and the Y direction. That is, the columnar electrode 20 is also oblique with respect to any of the Z direction, the X direction, and the Y direction. As described above, in the fourth embodiment, the columnar electrode 20 is wired using the spaces of respective portions C10 and C18 where the semiconductor chip 11 does not exist.

As illustrated in FIG. 6A, the electrode pads 18 are arranged in four rows in the row direction and five columns in the column direction. As illustrated in FIG. 6B, the electrode pads 15b are also arranged in four rows in the row direction and five columns in the column direction. Thus, the electrode pads 18 and the electrode pads 15b correspond to each other in a one to one ratio, and the respective corresponding electrode pads 18 and 15b are connected by the columnar electrode 20. The plurality of columnar electrodes 20 extend substantially parallel to each other without being in contact with each other.

For example, it is assumed that (1) to (4) in FIGS. 6A and 6B indicate rows and [1] to [5] indicate columns. At this time, the electrode pad 18 of (k) row and [j] column (k=1~4, j=1~5) is connected to the electrode pad 15b of (k) row and [j] column. The electrode pads 18 and 15b are arranged in the X and Y directions at substantially equal intervals, respectively. Thus, the columnar electrodes 20 are oblique at substantially the same angle, and do not in contact with each other.

As described above, in the fourth embodiment, the columnar electrode 20 is wired using the spaces of the respective portions C10 and C18 where the semiconductor chip 11 does not exist. Thus, the columnar electrode 20 may connect the electrode pads 15b and 18 of various arrangements.

Other configurations of the fourth embodiment may be the same as those of the second embodiment. Thus, the fourth embodiment may obtain the same effects as in the second embodiment. Further, the fourth embodiment may be applied to the first or third embodiment.

Fifth Embodiment

Figure 7:
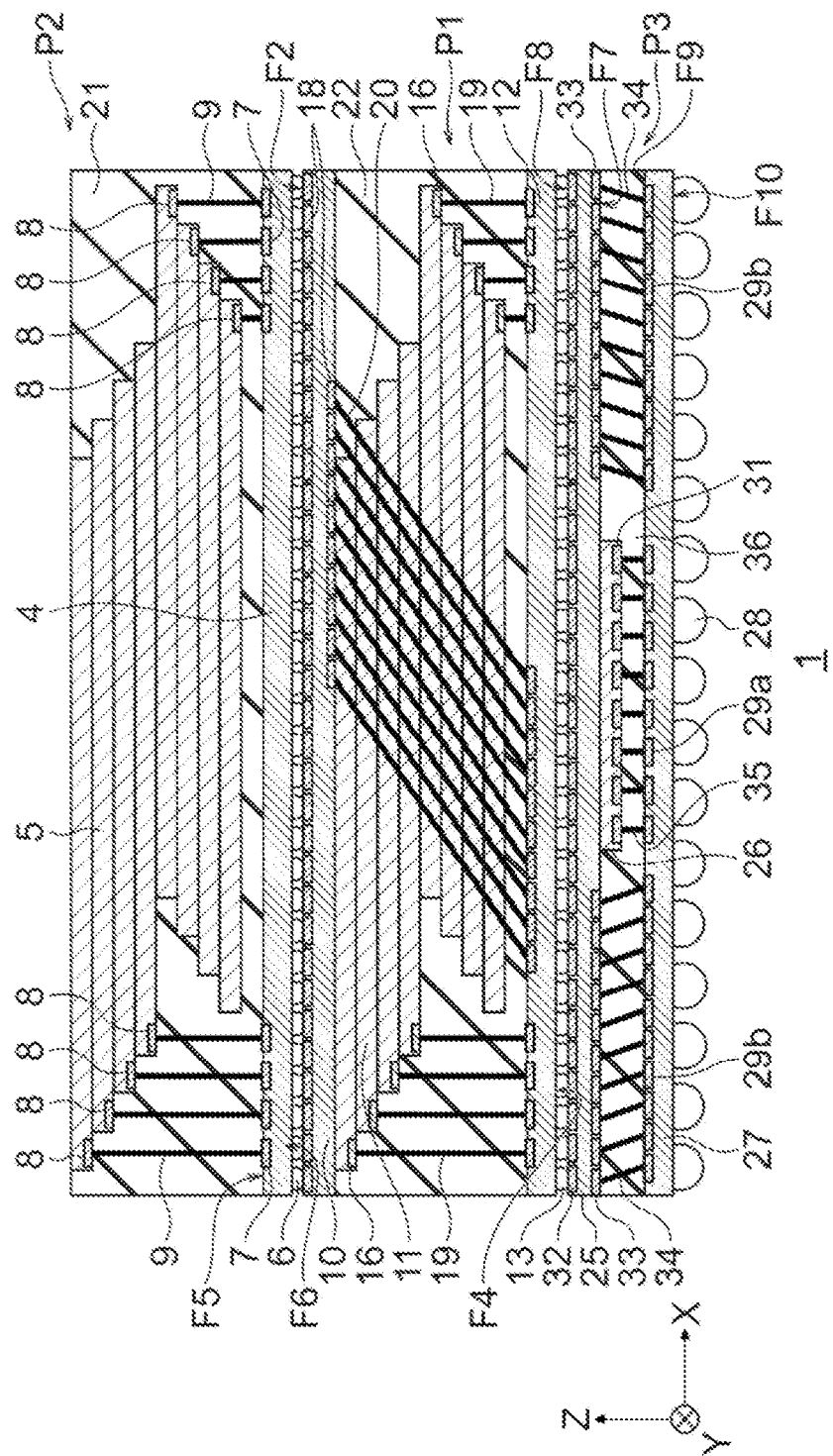
FIG. 7 is a schematic cross-sectional view illustrating a configuration example of a semiconductor device according to a fifth embodiment.

FIG. 7 is a schematic cross-sectional view illustrating a configuration example of the semiconductor device 1 according to a fifth embodiment. In the fifth embodiment, a further package P3 is provided under the package P1.

The packages P1 and P2 may have the same configuration as corresponding configuration of the second embodiment.

The package P3 includes wiring substrates 25 and 27, a semiconductor chip 26, columnar electrodes 34 and 35, a resin layer 36, and a metal bump 28. The package P3 is stacked on the fourth surface F4 side of the wiring substrate of the package P1.

The wiring substrate 25 has a seventh surface F7 and an eighth surface F8 opposite to the seventh surface F7. A plurality of electrode pads 33 are provided on the seventh surface F7. The electrode pads 33 are electrically connected, respectively, to any one of wiring layers of the wiring substrate 25. The wiring substrate 25 has a multilayer wiring structure (not illustrated) in which a plurality of wiring layers and a plurality of insulating layers are stacked. For the electrode pads 33 and the wiring layers, for example, a simple substance such as Al, Cu, Au, Ni, Pd, W, or Ti, a composite film of two or more of them, or a low-resistance metal such as an alloy of two or more of them is used. For the insulating layers, for example, an insulating member such as a glass epoxy resin is used. One or a plurality of semiconductor chips 26 are provided between the wiring substrate 25 and the wiring substrate 27.

The wiring substrate 27 has a ninth surface F9 and a tenth surface F10 opposite to the ninth surface F9. A plurality of electrode pads 29a and 29b are provided on the ninth surface F9. The electrode pads 29a and 29b are electrically connected to any one of wiring layers of the wiring substrate 27. The wiring substrate 27 has a multilayer wiring structure (not illustrated) in which a plurality of wiring layers and a plurality of insulating layers are stacked. For the electrode pads 29a and 29b and the wiring layers, for example, a simple substance such as Al, Cu, Au, Ni, Pd, W, or Ti, a composite film of two or more of them, or a low-resistance metal such as an alloy of two or more of them is used. For the insulating layers, for example, an insulating member such as a glass epoxy resin is used. The seventh surface F7 of the wiring substrate 25 and the ninth surface F9 of the wiring substrate 27 face each other, and one or the plurality of semiconductor chips 26 are provided therebetween.

One or the plurality of semiconductor chips 26 are provided on the seventh surface F7. Each semiconductor chip 26 has semiconductor elements (not illustrated) such as a transistor and a capacitor. The semiconductor chip 26 may be, for example, a controller which controls a memory chip or a semiconductor chip equipped with any LSI.

The semiconductor chip 26 is adhered to the wiring substrate 25 by an adhesive layer (not illustrated). The material of the adhesive layer is as described above.

An electrode pad 31 is electrically connected to any one of semiconductor elements provided in the semiconductor chip 26. For the electrode pad 31, for example, a simple substance such as Al, Cu, Au, Ni, Pd, W, or Ti, a composite film of two or more of them, or a low-resistance metal such as an alloy of two or more of them is used.

The columnar electrode 35 is connected between the electrode pad 31 of the semiconductor chip 26 and the electrode pad 29a of the wiring substrate 27, and extends in the Z direction substantially perpendicular to the seventh surface F7 and the ninth surface F9. The lower end of the columnar electrode 35 is connected to the electrode pad 31 by a wire bonding method. For the columnar electrode 35, for example, a conductive bonding wire such as a gold wire is used.

One end of the columnar electrode 34 is connected to the electrode pad 33 of the wiring substrate 25, and the other end thereof is connected to the electrode pad 29b of the wiring substrate 27. That is, the columnar electrode 34 connects between the electrode pad 33 and the electrode pad 29b. The electrode pads 33 and 29b which correspond to each other and are connected by one columnar electrode 34 are be shifted from each other in the X direction or the Y direction when viewed from the Z direction. Thus, the columnar electrode 34 extends in an oblique direction with respect to the Z direction substantially perpendicular to the seventh surface F7 and the ninth surface F9. The columnar electrode 34 may be further oblique with respect to the X direction and/or the Y direction. After being connected to the electrode pad 33 by a wire bonding method, the columnar electrode 34 is pulled out in the oblique direction and is cut to a predetermined length. A wire which is to be the columnar electrode 34 stands on its own in a state of extending in the oblique direction after cutting. For the columnar electrode 34, for example, a conductive bonding wire such as a gold wire is used.

The resin layer 36 covers (seals) the semiconductor chips 26 and the columnar electrodes 34 and 35 between the seventh surface F7 and the ninth surface F9. For the resin layer 36, for example, a resin such as a phenol based resin, a polyimide based resin, a polyamide based resin, an acryl based resin, an epoxy based resin, a PBO based resin, a silicone based resin, or a benzocyclobutene based resin, or an organic insulating material such as or a mixed material thereof or a composite material is used.

The metal bump 28 is provided on the tenth surface F10 of the wiring substrate 27. The metal bump 28 is electrically connected to the electrode pads 29a and 29b via the wiring substrate 27. The metal bump 28 is used for connection with any other wiring substrate or any other semiconductor package. For the metal bump 28, for example, a conductive material such as a solder is used.

An electrode pad 32 is provided on the eighth surface F8 of the wiring substrate 25, and is connected to the metal bump 13. In this way, the packages P1 to P3 are stacked and electrically connected to each other. Thus, for example, when the semiconductor chip 26 is a controller chip and the semiconductor chips 5 and 11 are memory chips, the controller chip 26 of the package P3 may control the memory chips 5 and 11 of the other packages P1 and P2.

According to at least one embodiment, the electrode pad 29b is connected to the electrode pad 33 via the oblique columnar electrode 34. Accordingly, the electrode pad 29b may be connected to the electrode pad 33 by a relatively short path without detouring. As a result, delay or attenuation of output signals from the semiconductor chip 26 to the semiconductor chips of the packages P1 and P2 may be prevented, and the reliability of the semiconductor device 1 may be improved.

In addition, the package P3 of the fifth embodiment may be applied to any one package P1 of the first to fourth embodiments.

Sixth Embodiment

Figure 8:
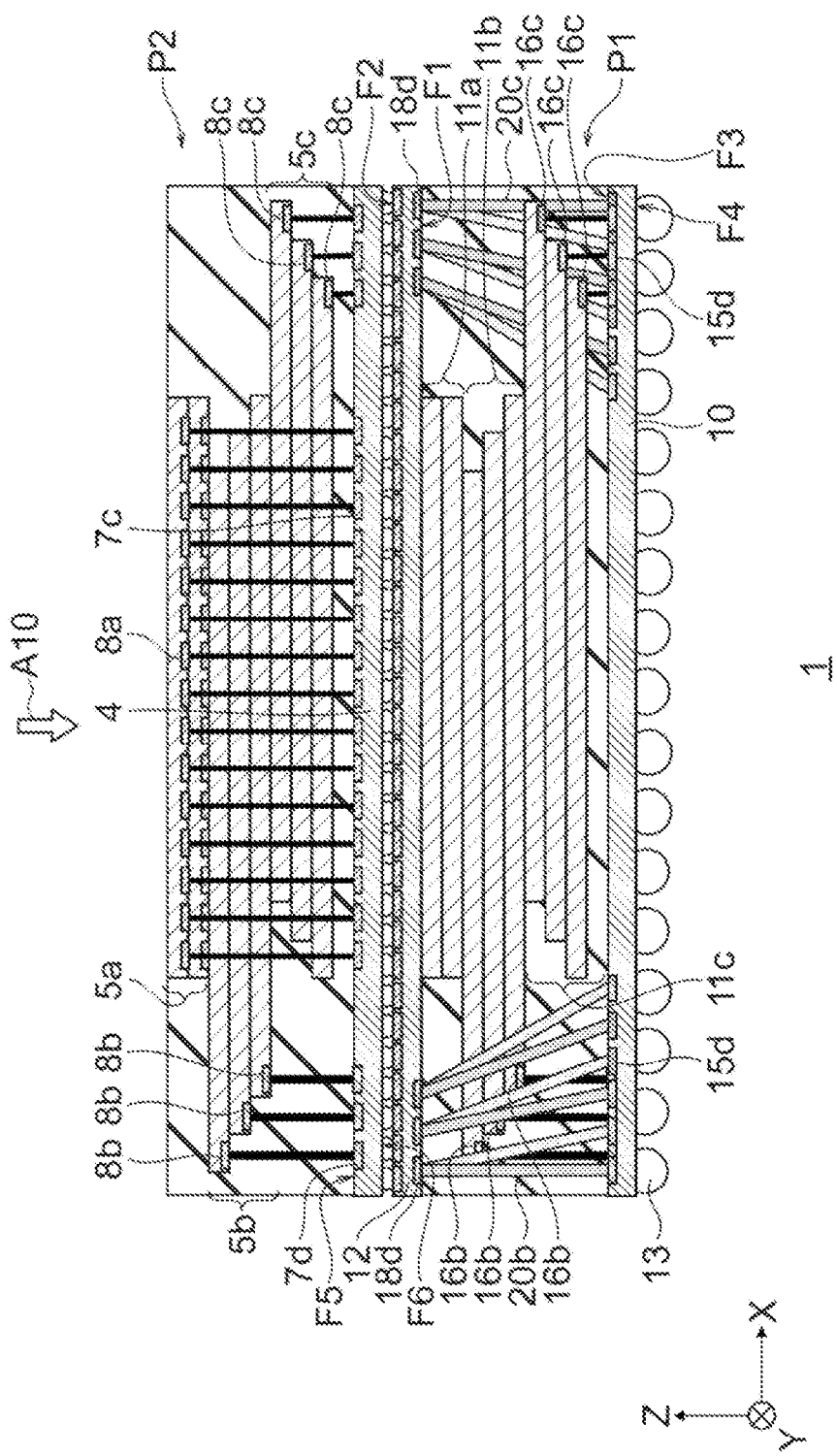
FIG. 8 is a schematic cross-sectional view illustrating a configuration example of a semiconductor device according to a sixth embodiment.
Figure 9:
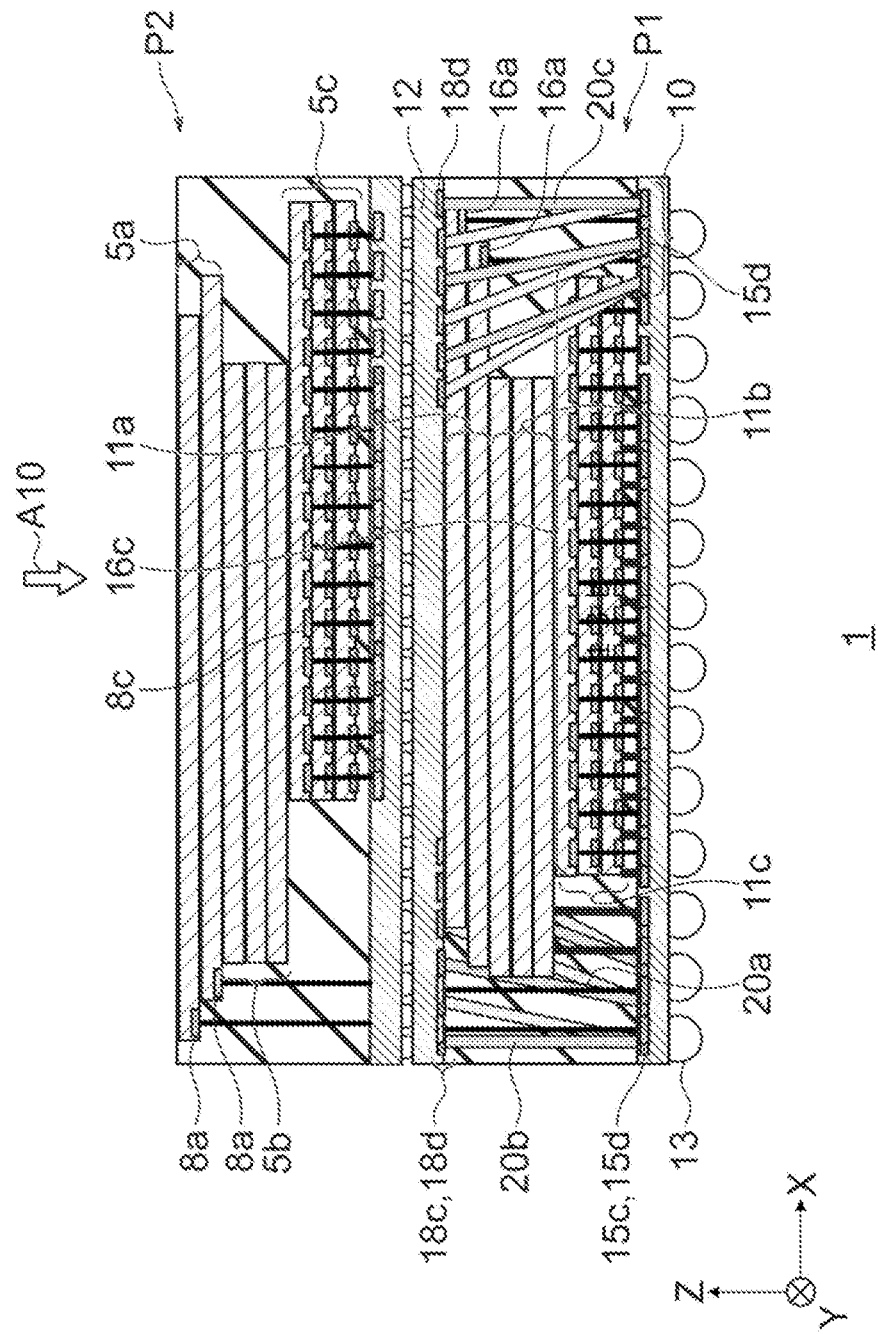
FIG. 9 is a schematic cross-sectional view illustrating a configuration example of the semiconductor device according to the sixth embodiment.
Figure 10:
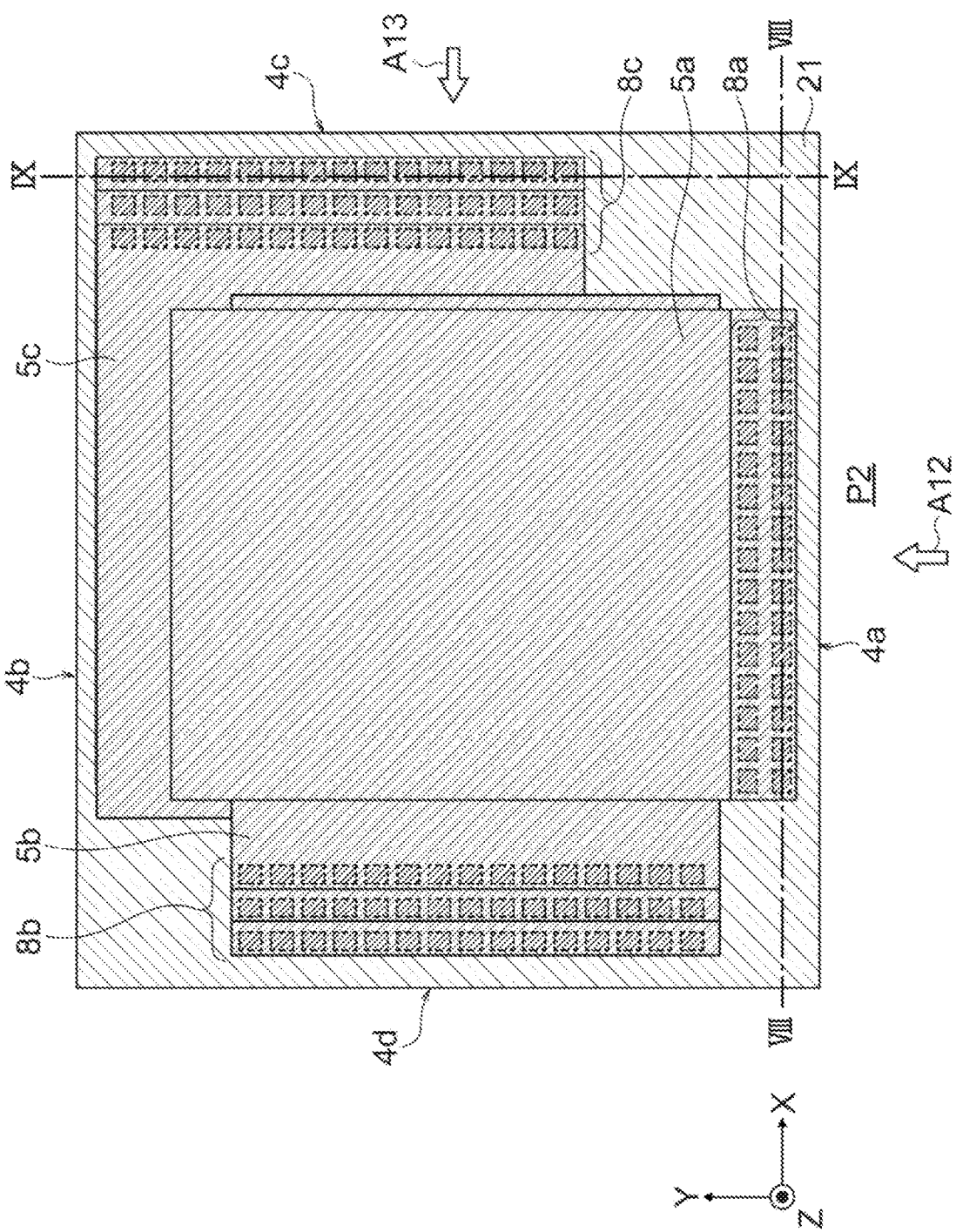
FIG. 10 is a schematic plan view illustrating a configuration example of a package according to the sixth embodiment.
Figure 11:
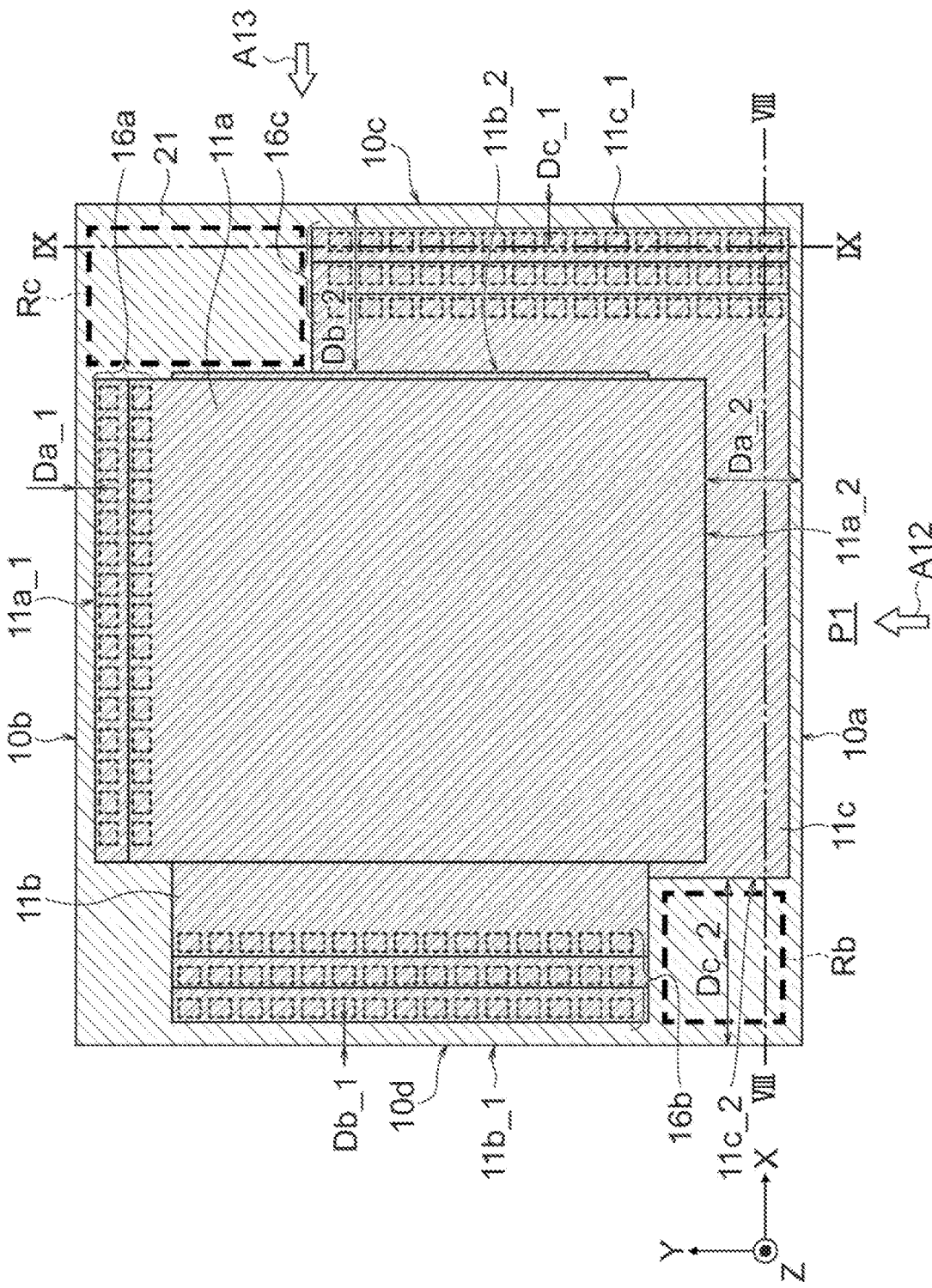
FIG. 11 is a schematic plan view illustrating a configuration example of a package according to the sixth embodiment.

FIGS. 8 and 9 are schematic cross-sectional views illustrating a configuration example of the semiconductor device 1 according to a sixth embodiment. FIG. 8 illustrates the cross section taken along line VIII-VIII in FIGS. 10 and 11. FIG. 9 illustrates the cross section taken along line IX-IX in FIGS. 10 and 11. FIG. 10 is a schematic plan view illustrating a configuration example of the package P2 according to the sixth embodiment. FIG. 11 is a schematic plan view illustrating a configuration example of the package P1 according to the sixth embodiment. Both of FIGS. 10 and 11 illustrate a plane as viewed from above in the Z direction (the direction of arrow A10 in FIGS. 8 and 9). Further, FIG. 8 illustrates the cross section as viewed from the direction of arrow A12 in FIGS. 10 and 11, and FIG. 9 illustrates the cross section as viewed from the direction of arrow A13 in FIGS. 10 and 11.

In the sixth embodiment, a method of arranging semiconductor chips 5a to 5c and 11a to 11c, a layout of electrode pads 15c and 15d in the wiring substrate 10, a layout of electrode pads 18c and 18d in the wiring substrate 12, a layout of electrode pads 7c and 7d in the wiring substrate 4, and a configuration of columnar electrodes 20a to 20c are different from the second embodiment. Other configurations of the sixth embodiment may be the same as corresponding configurations of the second embodiment.

As illustrated in FIGS. 8 to 10, in the package P2, a plurality of stacked semiconductor chips 5a to 5c are divided into three groups 5a to 5c. Each of the semiconductor chips of the group 5a has an electrode pad 8a. As illustrated in FIG. 10, the group 5a is stacked such that each electrode pad 8a is biased toward (closer to) a side 4a of the package P2. The group 5b is provided under the group 5a, and each of the semiconductor chips thereof has an electrode pad 8b. As illustrated in FIG. 10, the group 5b is stacked such that each electrode pad 8b is biased toward (closer to) a side 4d of the package P2. The group 5c is provided under the group 5b, and each of the semiconductor chips thereof has an electrode pad 8c. As illustrated in FIG. 10, the group 5c is stacked such that each electrode pad 8c is biased toward (closer to) a side 4c of the package P2.

As illustrated in FIGS. 8, 9 and 11, in the package P1, a plurality of stacked semiconductor chips 11a to 11c are divided into three groups 11a to 11c. As illustrated in FIG. 9, each of the semiconductor chips of the group 11a has an electrode pad 16a. As illustrated in FIG. 11, the semiconductor chips of the group 11a are stacked such that each electrode pad 16a is biased toward (closer to) the side 10b of the package P1. The group 11b is provided under the group 11a, and as illustrated in FIG. 8, each of the semiconductor chip thereof has an electrode pad 16b. As illustrated in FIG. 11, the group 11b is stacked such that each electrode pad 16b is biased toward (closer to) a side 10d of the package P1. The group 11c is provided under the group 11b, and as illustrated in FIGS. 8 and 9, each of the semiconductor chips thereof has an electrode pad 16c. As illustrated in FIG. 11, the group 11c is stacked such that the electrode pad 16c is biased toward (closer to) the side 10c of the package P1.

As illustrated in FIG. 11, when viewed in a plan view from the Z direction, the distance between a first side 11a_1 of the semiconductor chip 11a where the electrode pad 16a is provided and the fourth side 10b of the package P1 close to the side 11a_1 is Da_1. The distance between a fifth side 11a_2 of the semiconductor chip 11a opposite to the side 11a_1 and the sixth side 10a of the package P1 opposite to the side 10b is Da 2. At this time, the distance Da_1 is shorter than the distance Da 2. Similarly, the distance between a side 11b_1 of the semiconductor chip 11b where the electrode pad 16b is provided and the side 10d of the package P1 close to the side 11b_1 is Db_1. The distance between a side 11b_2 of the semiconductor chip 11b opposite to the side 11b_1 and the side 10c of the package P1 opposite to the side 10d is Db_2. At this time, the distance Db_1 is shorter than the distance Db_2. Further, the distance between the side 11c_1 of the semiconductor chip 11c where the electrode pad 16c is provided and the side 10c of the package P1 close to the side 11c_1 is Dc_1. The distance between a side 11c_2 of the semiconductor chip 11c opposite to the side 11c_1 and the side 10d of the package P1 is Dc 2. At this time, the distance Dc_1 is shorter than the distance Dc 2.

As described above, by arranging the electrode pads 16a to 16c of the semiconductor chips of the respective groups 11a to 11c so as to be biased to any one of the sides 10a to 10d of the package P1, spaces Rb and Rc are obtained near the sides 11a_2, 11b_2 and 11c_2 opposite to the sides 11a_1, 11b land 11c_1 where the electrode pads 16a to 16c are provided. In the sixth embodiment, the space Rb is provided in each portion defined by the sides 10a and 10d of the package P1. The space Rc is provided in each portion defined by the sides 10b and 10c of the wiring substrates 10 and 12 of the package P1. The electrode pads 15d and 18d to which the columnar electrodes 20b and 20c illustrated in FIGS. 8 and 9 are connected are arranged in the spaces Rb and Rc. In the spaces Rb and Rc, as illustrated in FIG. 8, the columnar electrodes 20b and 20c are wired in an oblique direction with respect to the Z direction.

In addition, although not illustrated, the plurality of packages P1 stacked as in the third embodiment may be provided under the package P2.

Figure 12:
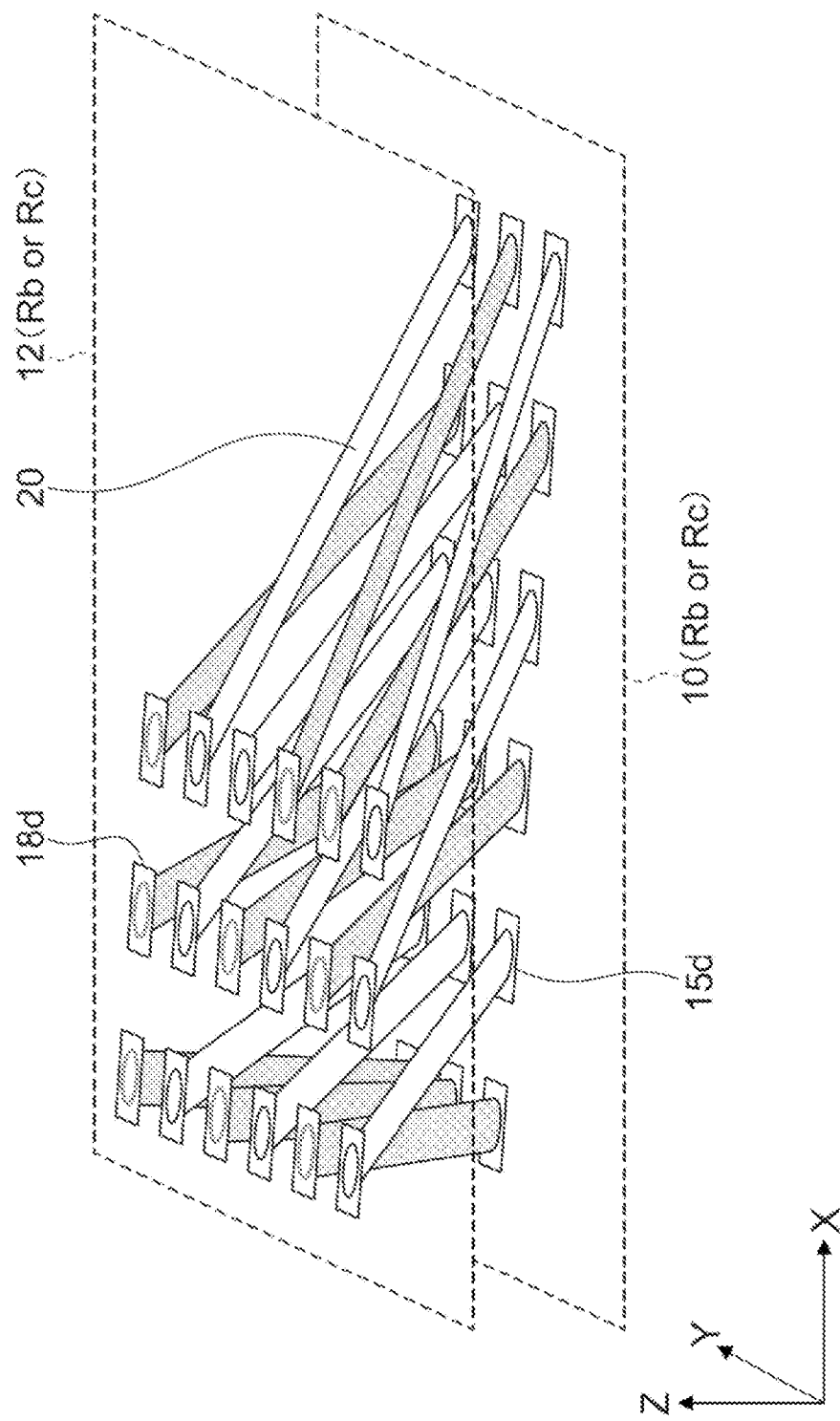
FIG. 12 is a schematic perspective view illustrating an arrangement example of electrode pads and a configuration example of a columnar electrode according to the sixth embodiment.

FIG. 12 is a schematic perspective view illustrating an arrangement example of the electrode pads 15d and 18d and a configuration example of the columnar electrode 20 according to the sixth embodiment. The electrode pads 15d and 18d are arranged on the wiring substrates 10 and 12, respectively, and are provided in, for example, the spaces Rb and Rc.

The electrode pads 15d are arranged in three rows in the row direction and six columns in the column direction on the wiring substrate 10 when viewed in a plan view from the Z direction. The electrode pads 18d are arranged in six rows in the row direction and three columns in the column direction on the wiring substrate 12 when viewed in a plan view from the Z direction. Although the electrode pads 15d and the electrode pads 18d are different from each other in arrangement (the number of rows and the number of columns), they are provided in the same number of 18 and correspond to each other in a one to one ratio. Accordingly, the columnar electrodes 20 may connect the electrode pad 15*d* and the electrode pad 18*d* in a one to one ratio.

In this way, even when the electrode pads 15*d* and 18*d* are configured to be arranged respectively in different matrices, there is no short-circuit therebetween and the electrode pads 15*d* and the electrode pads 18*d* may be connected to each other in a one to one ratio since the columnar electrodes 20 are wired obliquely in the Z direction. At this time, the angles of the columnar electrodes 20 may be different from each other.

In general, the electrode pads 15*d* may be arranged on the wiring substrate 10 in m rows in the row direction and n columns in the column direction (m and n being integers greater than or equal to 1, and m≠n). The electrode pads 18*d* are arranged on the wiring substrate 12 in n rows in the row direction and m columns in the column direction. The columnar electrodes 20 extend obliquely in the Z direction, and may connect the corresponding electrode pads 15*d* and 18*d* to each other in a one to one ratio without short-circuit therebetween.

Next, a method of manufacturing the semiconductor device 1 (package P1) according to the first embodiment will be described. In addition, since the semiconductor device or the packages P1 and P2 according to the second to sixth embodiments may be easily understood from the manufacturing method of the first embodiment, detailed descriptions thereof will be omitted.

FIGS. 13 to 16 are schematic cross-sectional views illustrating an example of a method of manufacturing the semiconductor device 1 (package P1) according to the first embodiment. In addition, FIGS. 13 to 16 illustrate an inversed structure of FIG. 1 in the Z direction.

Figure 13:
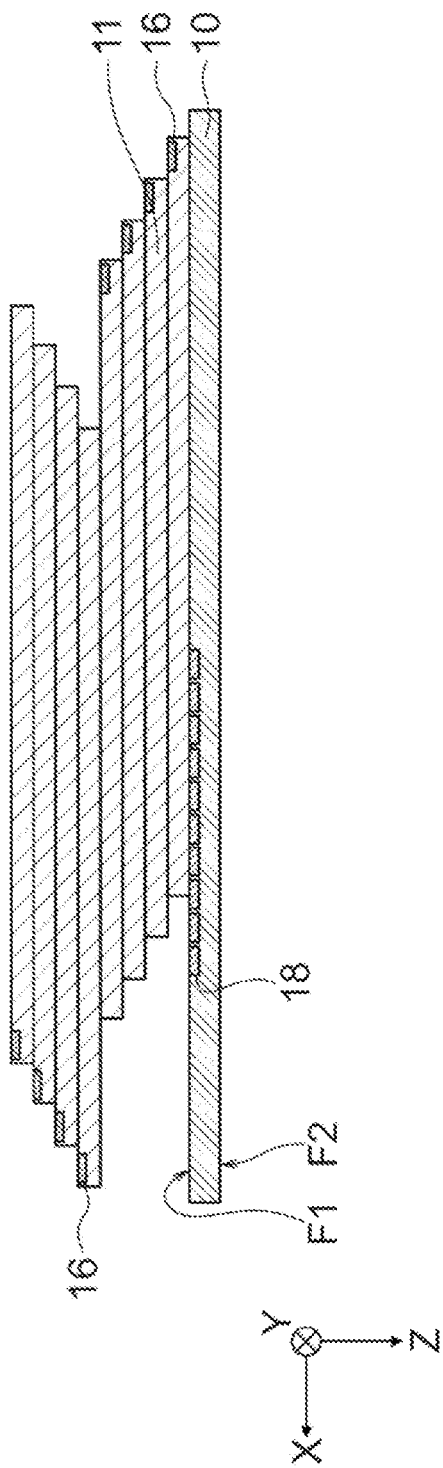
FIG. 13 is a schematic cross-sectional view illustrating an example of a method of manufacturing the semiconductor device according to the first embodiment.

First, the wiring substrate 10 having the first surface F1 provided with the plurality of electrode pads 18 and the second surface F2 opposite to the first surface F1 is prepared. Next, as illustrated in FIG. 13, the plurality of semiconductor chips 11 are stacked on the first surface F1 of the wiring substrate 10. The semiconductor chips 11 each have the electrode pad 16.

Figure 14:
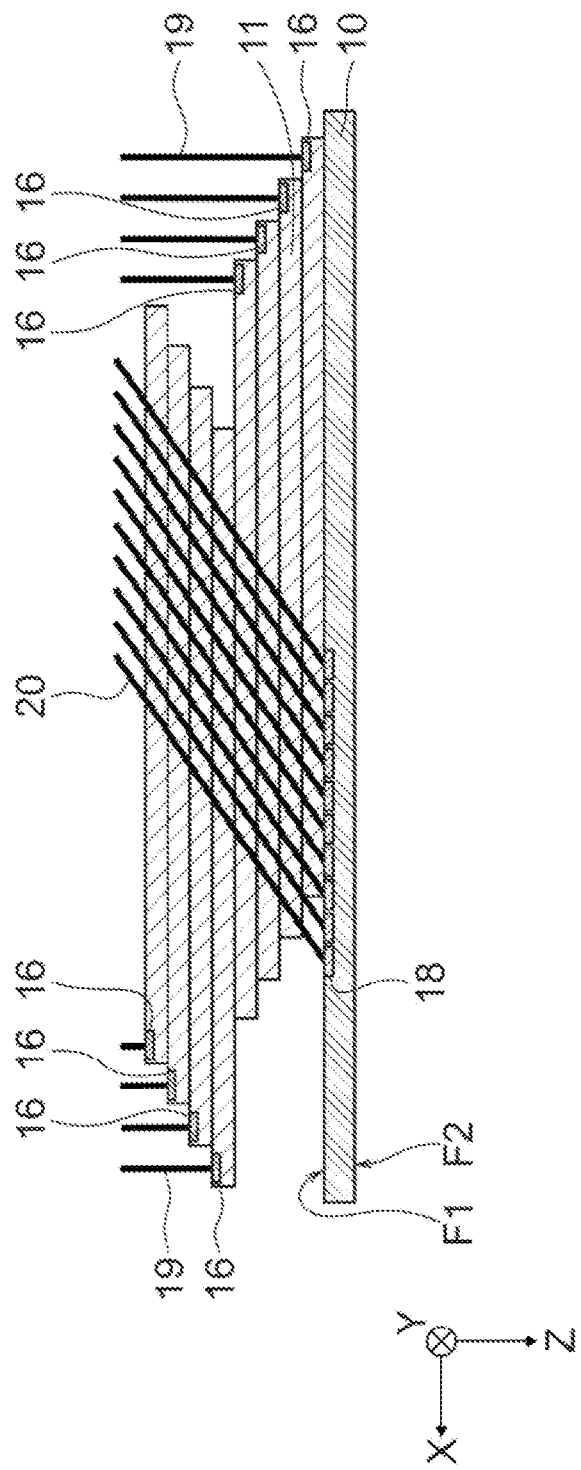
FIG. 14 is a schematic cross-sectional view illustrating the example of the method of manufacturing the semiconductor device, continued from FIG. 13.

Next, as illustrated in FIG. 14, a metal wire is bonded on the electrode pad 16 of the semiconductor chip 11 by a wire bonding method, and the metal wire is pulled out in a direction substantially perpendicular to the first surface F1 to form the columnar electrode 19. The columnar electrode 19 is cut at the upper end thereof, and remains in an upright state as it is by the rigidity thereof.

Further, a metal wire is bonded on the electrode pad 18 of the wiring substrate 10 by a wire bonding method, and the metal wire is pulled out in an oblique direction with respect to the Z direction to form the columnar electrode 20. The columnar electrode 20 is cut at the upper end thereof, and remains in an oblique state as it is by the rigidity thereof. Accordingly, the plurality of columnar electrodes 20 remain in a substantially parallel state while being oblique so as not to come into contact each other.

For the columnar electrodes 19 and 20, for example, a simple substance such as Cu, Ni, W, Au, Ag, Pd, Sn, Bi, Zn, Cr, Al, or Ti, a composite material of two or more of them, or an alloy of two or more of them is used. Preferably, as the material of the columnar electrodes 19 and 20, for example, a simple substance of Au, Ag, Cu, or Pd, a composite material of two or more of them, or an alloy of two or more of them is used. More preferably, as the material of the columnar electrodes 19 and 20, a material having a high hardness, for example, Cu, a CuPd alloy, or a material in which Cu is covered with Pd is used. Thus, when the columnar electrodes 19 and 20 are covered with the resin layer 22, they are difficult to bend and are difficult to collapse.

Figure 15:
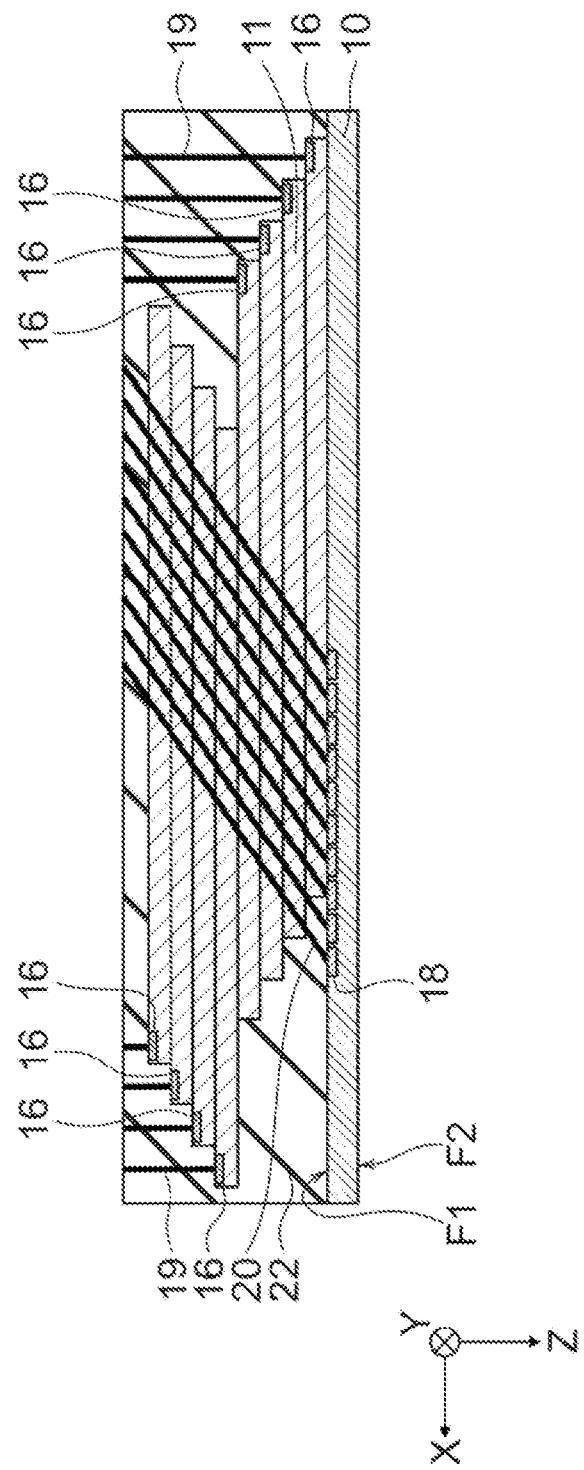
FIG. 15 is a schematic cross-sectional view illustrating the example of the method of manufacturing the semiconductor device, continued from FIG. 14.

Next, as illustrated in FIG. 15, a stack of the semiconductor chips 11 and the columnar electrodes 19 and 20 are covered with the resin layer 22. For the resin layer 22, for example, a resin such as an epoxy based resin, a phenol based resin, a polyimide based resin, a polyamide based resin, an acryl based resin, a PBO based resin, a silicone based resin, or a benzocyclobutene based resin, a mixture thereof, or a composite material is used. Examples of an epoxy resin may include, but be not specifically limited to, a bisphenol type epoxy resin such as a bisphenol A type, bisphenol F type, bisphenol AD type, or bisphenol S type, a novolak type epoxy resin such as a phenol novolak type or cresol novolak type, a resorcinol type epoxy resin, an aromatic epoxy resin such as trisphenolmethane triglycidyl ether, a naphthalene type epoxy resin, a fluorene type epoxy resin, a dicyclopentadiene type epoxy resin, a polyether modified epoxy resin, a benzophenone type epoxy resin, an annealing type epoxy resin, an NBR modified epoxy resin, a CTBN modified epoxy resin, and a hydrogenated product thereof. Among these, a naphthalene type epoxy resin and a dicyclopentadiene type epoxy resin are preferable in consideration of good adhesiveness with silicone. Further, a benzophenone type epoxy resin is also preferable since it is easy to obtain a quick hardening property. These epoxy resins may be used alone or as a combination of two or more types. Further, a filler such as a silica may be contained in the resin layer 22.

Next, the resin layer 22 is cured by heating using an oven, or by irradiation of UV light.

Next, the resin layer 22 is polished using a CMP method or a mechanical polishing method until the upper ends of the columnar electrodes 19 and 20 are exposed. Thus, the structure illustrated in FIG. 15 is obtained.

Figure 16:
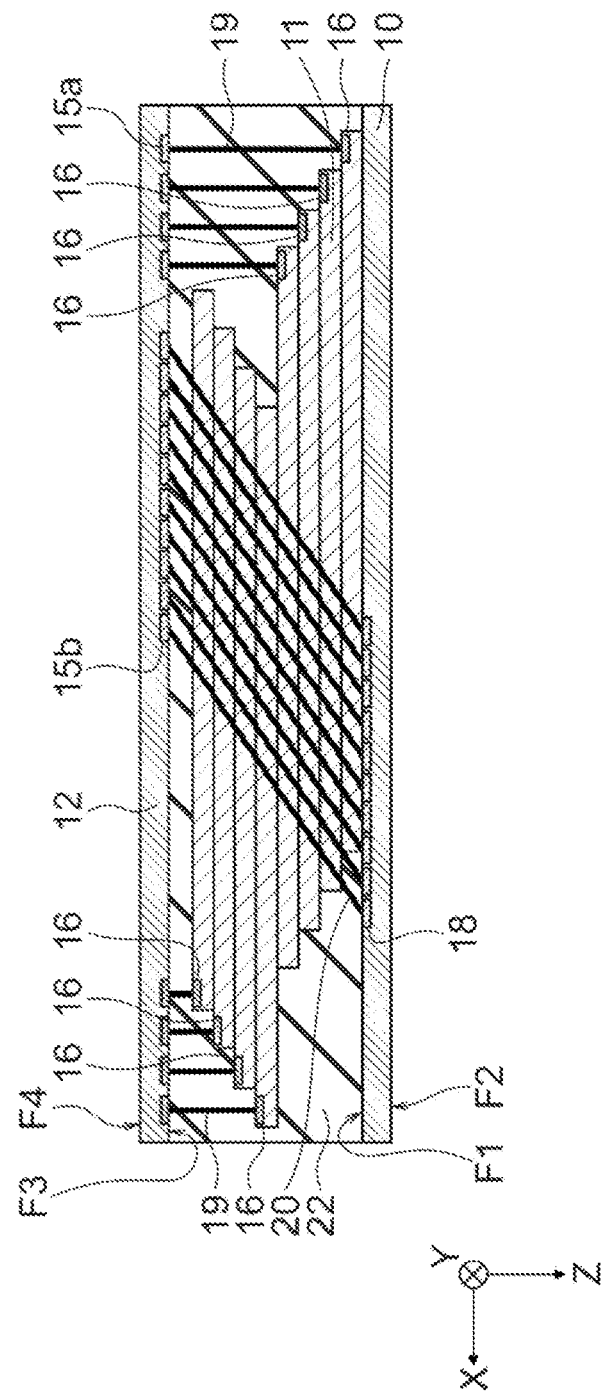
FIG. 16 is a schematic cross-sectional view illustrating the example of the method of manufacturing the semiconductor device, continued from FIG. 15.

Next, as illustrated in FIG. 16, the wiring substrate (rewiring layer) 12 is stacked on the resin layer 22. The electrode pad 15*a* of the wiring substrate 12 is connected to the columnar electrode 19, and the electrode pad 15*b* is connected to the columnar electrode 20. The columnar electrodes 19 and 20 are pulled out in advance upon wire bonding so as to correspond to the electrode pads 15*a* and 15*b*.

Thereafter, as illustrated in FIG. 1, the metal bump 13 is formed on the second surface F2 of the wiring substrate 10. Thus, the semiconductor device 1 illustrated in FIG. 1 is completed.

In the second embodiment, as illustrated in FIG. 5, the package P2 is stacked on the wiring substrate 10 of the package P1. Thus, the metal bump 6 of the wiring substrate 4 of the package P2 is connected to the electrode pad 18 on the second surface F2 of the wiring substrate 10 of the package P1. In this way, the semiconductor device 1 according to the second embodiment may be manufactured.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:
a first wiring substrate having a first surface and a second surface, the second surface opposite to the first surface, the first wiring substrate including a plurality of first electrode pads on the first surface;
a second wiring substrate having a third surface and a fourth surface, the third surface facing the first surface, the fourth surface opposite to the third surface, the second wiring substrate including a plurality of second electrode pads on the third surface;
a plurality of first semiconductor chips between the first surface and the third surface;
a first columnar electrode extending in an oblique direction relative to the first surface and the third surface, the first columnar electrode configured to connect the plurality of first electrode pads and the plurality of second electrode pads; and
a first resin layer configured to cover the plurality of first semiconductor chips and the first columnar electrode between the first surface and the third surface.

2. The semiconductor device according to claim 1, wherein the second wiring substrate includes a plurality of third electrode pads provided on the third surface,
the first semiconductor chip includes a fourth electrode pad provided on a surface of the first semiconductor chip facing the third surface of the second wiring substrate, and
wherein the semiconductor device further comprises a second columnar electrode configured to connect the third electrode pad and the fourth electrode pad, and extending in the first direction.

3. The semiconductor device according to claim 1, further comprising:
a metal bump provided on the second surface of the first wiring substrate or on the fourth surface of the second wiring substrate, and electrically connected to the plurality of first or second electrode pads via the first or second wiring substrate.

4. The semiconductor device according to claim 3, wherein the metal bump is formed of solder.

5. The semiconductor device according to claim 1, wherein the first electrode pad and the second electrode pad connected by the first columnar electrode are offset from each other when viewed in a plan view from a direction perpendicular to the first surface.

6. The semiconductor device according to claim 1, further comprising:
a first package including the first wiring substrate, the plurality of first semiconductor chips, the second wiring substrate, and the first columnar electrode; and
a second package including:
a third wiring substrate having a fifth surface and a sixth surface opposite to the fifth surface,
a plurality of fifth electrode pads on the fifth surface,
a plurality of second semiconductor chips stacked above the fifth surface of the third wiring substrate,
a third columnar electrode extending in the first direction and configured to connect between a sixth electrode pad provided on the second semiconductor chip and the fifth electrode pad, and
a second resin layer configured to cover the plurality of second semiconductor chips and the third columnar electrode on the fifth surface side,
wherein the second package is stacked on and electrically connected to the first wiring substrate.

7. The semiconductor device according to claim 6, wherein the second semiconductor chips are arranged in three groups separated from each other.

8. The semiconductor device according to claim 6, further comprising a third package stacked on, and electrically connected to, the second package.

9. The semiconductor device according to claim 1, wherein, when viewed in a plan view from the first direction,
the first electrode pads are arranged in m rows in a row direction and n columns in a column direction on the first wiring substrate, where m and n are integers greater than or equal to 1 and m≠n), and
the second electrode pads are arranged in n rows in the row direction and m columns in the column direction on the second wiring substrate.

10. The semiconductor device according to claim 1, wherein the semiconductor device includes a NAND memory.

11. The semiconductor device according to claim 10, wherein the semiconductor device includes a memory cell array.

12. The semiconductor device according to claim 1, wherein the first semiconductor chips are offset relative to each other when viewed in a plan view from the first direction.

13. The semiconductor device according to claim 1, wherein the first columnar electrode includes a bonding wire.

14. The semiconductor device according to claim 13, wherein the bonding wire includes gold.

15. A method of manufacturing a semiconductor device, the method comprising:
stacking a plurality of first semiconductor chips on a first wiring substrate having: (i) a first surface, the first surface provided with a plurality of first electrode pads, and (ii) a second surface opposite to the first surface;
forming a first columnar electrode by:
bonding a wire to one of the plurality of first electrode pads,
pulling out the wire in an oblique direction with respect to a first direction substantially perpendicular to the first surface, and
cutting the wire;
covering the plurality of first semiconductor chips and the first columnar electrode with a first resin layer;
polishing the first resin layer to expose the first columnar electrode; and
stacking a second wiring substrate on the first resin layer, and electrically connecting the first columnar electrode to a second electrode pad provided on the second wiring substrate.

* * * * *